US007791165B2

(12) United States Patent
Tanaka

(10) Patent No.: US 7,791,165 B2
(45) Date of Patent: Sep. 7, 2010

(54) PLANAR INDUCTOR AND METHOD OF MANUFACTURING IT

(75) Inventor: Kazuaki Tanaka, San Cugat del Valles (ES)

(73) Assignee: Seiko Epson Corporation (JP)

( * ) Notice: Subject to any disclaimer, the term of this patent is extended or adjusted under 35 U.S.C. 154(b) by 523 days.

(21) Appl. No.: 11/579,747

(22) PCT Filed: May 9, 2005

(86) PCT No.: PCT/EP2005/005129

§ 371 (c)(1),
(2), (4) Date: Sep. 24, 2007

(87) PCT Pub. No.: WO2005/114684

PCT Pub. Date: Dec. 1, 2005

(65) Prior Publication Data

US 2008/0157272 A1 Jul. 3, 2008

(30) Foreign Application Priority Data

May 13, 2004 (EP) .................................. 04076429

(51) Int. Cl.
*H01L 29/00* (2006.01)

(52) U.S. Cl. ............................... 257/531; 257/E21.022

(58) Field of Classification Search ................. 257/531, 257/E21.022; 336/200; 438/381
See application file for complete search history.

(56) References Cited

U.S. PATENT DOCUMENTS 2,843,829 A 7/1958 Slate
6,703,710 B1 * 3/2004 Hopper et al. .............. 257/758
6,740,956 B1 * 5/2004 Hopper et al. .............. 257/528
6,853,079 B1 * 2/2005 Hopper et al. .............. 257/758
6,864,581 B1 * 3/2005 Hopper et al. .............. 257/758
7,078,998 B2 * 7/2006 Zhang et al. ................ 257/531
7,169,684 B2 * 1/2007 Lee et al. .................... 438/459
2002/0170743 A1 * 11/2002 Boret ......................... 174/250
2003/0030532 A1 * 2/2003 Iida ............................ 336/200

FOREIGN PATENT DOCUMENTS

JP 58-073105 A 5/1983
JP 08-288463 A 11/1996
JP 09-251999 9/1997

OTHER PUBLICATIONS

International Search Report for PCT/EP2005/005129, ISA/EP, Rijswijk, mailed Aug. 10, 2005.

* cited by examiner

*Primary Examiner*—Mark Prenty
(74) *Attorney, Agent, or Firm*—Harness, Dickey & Pierce, P.L.C.

(57) ABSTRACT

A planar inductor comprises a metal element (11-14) on a substrate (300, 310), said metal element being provided with at least one groove (20) extending along and into said element from at least one surface (2) of said element. Said groove or grooves (20) extend into the element in a direction substantially perpendicular to the surface of the substrate (300, 310), giving rise to a higher Q value and a lower serial resistance are also achieved. The inductor may comprise grooved (11, 13, 14) and non-grooved (12) layers.

The invention also relates to a method of manufacturing the inductor.

24 Claims, 4 Drawing Sheets

PLANAR INDUCTOR AND METHOD OF MANUFACTURING IT

TECHNICAL FIELD

The invention relates to inductors and, especially, to planar metal inductors of the type used in integrated circuits.

STATE OF THE ART

Many types of inductors are known. In integrated circuits (IC), the most common types of inductors are planar inductors with a spiral structure or similar. FIGS. 1A and 1B show a top view and a vertical cross section of a prior art inductor 100, connected to a metal conductor 200 by a so-called via 201. Depending on the method and technology of manufacture, the inductor can be made up of a plurality (in this case, two) of metal layers 101 and 102, normally of the same metal. This is normally the case when manufacturing the integrated circuits using, for example, CMOS or Bipolar IC processes. In any case, normally, in most known prior art IC inductors, the metal part (or, rather, each section of the metal part) has a substantially rectangular cross section.

This kind of semiconductor integrated planar inductors normally have a rather low Q value. Also, recently, these inductors are manufactured in sub-micron processes, whereby the serial resistance of the inductor can be a serious problem for high frequency applications, such as applications in mobile telephony devices, etc.

Normally, to reduce the serial resistance, materials having a good conductivity are used to form the metal layers of the inductor. Also, inductors having wide metal layers can be used, but such a wide layers tend to have a large parasitic capacitance with regard to the substrate on which the inductors are formed.

Further, heat generated by the inductor itself is another problem appearing in applications involving high currents, such as power amplifiers.

When applying high frequency signals to an inductor, the serial resistance of an inductor is related with the skin effect, represented by the following equation:

$$\delta = \sqrt{2\rho/\omega\cdot\mu} = \sqrt{\rho/\pi\cdot f\cdot\mu}$$

where ρ is resistivity, ω is angular frequency, f is frequency and μ is permeability.

Due to the skin effect, the high frequency signal flows near the surface of the metal of the inductor; this implies that the high frequency resistance (conductance) of the inductor depends on the surface area of the metal of the inductor. Now, if this surface area increases, the skin effect is reduced and so the serial resistance of the inductor.

On the other hand, the Q value of the inductor can be expressed by the following equation:

$$Q = \omega\cdot L/R = \omega\cdot L\cdot S/l\cdot\rho$$

where L is inductance, R is resistance, S is surface area and l is the length of inductor. Thus, also the Q value depends on the surface area. If the surface area increases, the Q value increases.

A high Q value is important in many situations. For example, in high frequency circuits, inductors are often used as matching components, in filters, etc., and the frequency selectivity of the inductor is important. Components with a high Q value have good frequency characteristics.

JP-A-8-288463 and JP-A-9-251999 both disclose metal inductors on substrates, having grooves in their "sides", that is, grooves entering into the metal body of the inductors in a direction generally parallel with the surface of the substrate (these grooves could be referred to as "horizontal" grooves). Basically, these grooves give rise to a certain increase in the surface area of the metal, and thus may provide for reduced serial resistance and for an increase in the Q value of the inductor. However, normally, the extension of the metal layers in the direction perpendicular to the substrate (the "vertical" direction) is very small (frequently, below 0.5 μm). Thus, when using the approaches disclosed in these prior art documents, it seems to be difficult to provide a large number of grooves having a sufficient "depth" (entering far into the metal layer).

Further, the grooves of JP-A-8-288463 and JP-A-9-251999 are made using photolithography; by radiation giving rise to standing waves, slots are produced in walls of the "mould" which, when filled with metal, gives rise to the corresponding grooves in the walls of the metal. This method does not form part of the conventional methods for producing planar inductors for integrated circuits.

DESCRIPTION OF THE INVENTION

The invention aims at providing inductors having a (comparatively) high Q value and a (comparatively) low serial resistance by means of, considering the skin effect, substantially increasing the surface area of the inductor.

A first aspect of the invention relates to a planar inductor, comprising a metal element on a substrate, said metal element being provided with at least one groove extending along and into said element from at least one surface of said element. In accordance with the invention, said at least one groove extends into the element in a direction substantially perpendicular to the surface of the substrate.

As, normally, the "width" of the metal element (or of the layers) making up the inductor (that is, the extension of the cross section of a portion of said element in the direction parallel with the surface of the substrate) is larger than its "height" (the extension in the direction perpendicular to the substrate), by making the grooves in a direction perpendicular to the substrate, it will be easier to provide grooves having a sufficient "depth" and "width" so as to achieve the objectives outlined above (higher Q value and lower serial resistance at high frequencies, due to a large metal surface area achieved without increasing the general outside dimensions of the metal element, that is, the space it occupies in a two-dimensional plane parallel with the surface of the substrate).

Further, in this manner, the grooves can be easily produced within the framework of the conventional methods for production of planar inductors, and without any need for applying the specific photolithography method disclosed in the prior art references discussed above.

Further, the specific design and dimensions of the metal element, such as width and length of the grooves, can be easily varied and adapted in accordance with the desired characteristics of the inductor, within foundry process rules and using conventional manufacturing processes.

Thus, the invention provides for an easily implemented and flexible way of increasing the effective surface area of the conductive elements of planar inductors, with the corresponding reduction in serial resistance and increase in the Q value of the inductor, especially at high frequencies.

The inductor can be a layered conductor, comprising at least two superposed metal layers (preferably of the same metal) each extending in a direction parallel to the substrate, whereby at least one of said layers is provided with one or more of said grooves. This constitution of the metal element making up the inductor can be advantageous, as it makes it possible to create the grooves and to determine their dimensions (such as their "height" or "depth") using conventional layer construction IC processes. This provides for easy implementation using conventional processes, and easily implemented flexibility in the choice of dimensions of the grooves. For "deeper" grooves, one can simply add additional "grooved layers".

The use of layers also makes it possible to exactly determine the dimensions of the grooves by applying, selectively, "grooved" and "non-grooved" layers, as can be easily understood from the discussion regarding preferred embodiments (see below).

Of course, it is also possible to use one single metal layer and to provide grooves by, for example, etching said grooves in said metal layer, down to the desired depth; however, this method may prove to be less preferable, for example, in what regards how to obtain exactly the desired dimensions of the grooves.

If the inductor is a planar inductor based on superimposed layers, one or more of said layers may not be provided with said groove or grooves; the choice of number of grooved and non-grooved layers can be based on optimisation of surface area and process requirements (such as the number of grooves that can be obtained with a certain process in a layer having a certain width, etc.). The skilled person can select the optimum number of layers and grooves and their dimensions, in view of the process, material and dimension requirements.

For example, if the inductor is made up of metal layers, the grove or grooves may extend all through at least on of said layer, from a first surface of said layer to a second surface of said layer, reaching another layer of said inductor. Thus, the inductor can be made up of completely grooved layers (layers in which the grooves reach through from one surface to the opposite surface) and layers not having any grooves at all; the depth of the grooves will correspond exactly to sum of the heights of the grooved layers.

The inductor can comprise at least three metal layers, the groove or grooves reaching from a surface of said inductor and all through at least two of said layers until reaching a layer not being provided with grooves.

The inductor can comprise at least three metal layers, a layer not being provided with grooves being sandwiched between layers being provided with grooves.

The inductor can be a spiral inductor, that is, an inductor having a spiral shape (in the plane of the substrate); then, preferably, the groove or grooves also have spiral shapes corresponding to the spiral shape of the inductor, that is, the grooves follow the path of the inductor.

The grooves are preferably arranged substantially in parallel.

The metal element (made up of layers or not) can have a substantially rectangular cross section.

In order to provide for an adequate increase in surface area, the grooves can extend into the metal element to an extent corresponding to, at least, 50% of the "height" of the metal element (that is, to its extension in the direction perpendicular to the surface of the substrate).

It may be preferable that the grooves extend into the metal element to an extent corresponding to, at least, 75% of the "height" of the metal element.

Another aspect of the invention relates to a method of manufacturing a planar inductor, comprising the steps of:

applying or depositing a metal element onto a substrate; and providing said metal element with grooves.

In accordance with this aspect of the invention, the grooves are made to extend into the metal element in a direction substantially perpendicular to the surface of the substrate.

The step of applying a metal element on a substrate can comprise the step of applying at least one metal layer on a substrate, and the step of providing the metal element with grooves can comprise the steps of:

applying a non-metal material on said at least one metal layer;

creating grooves in said non-metal material, said grooves being separated by partitions of said non-metal material;

filling said grooves with metal, thus creating a grooved metal layer.

DESCRIPTION OF PREFERRED EMBODIMENTS OF THE INVENTION

Figure 2B:
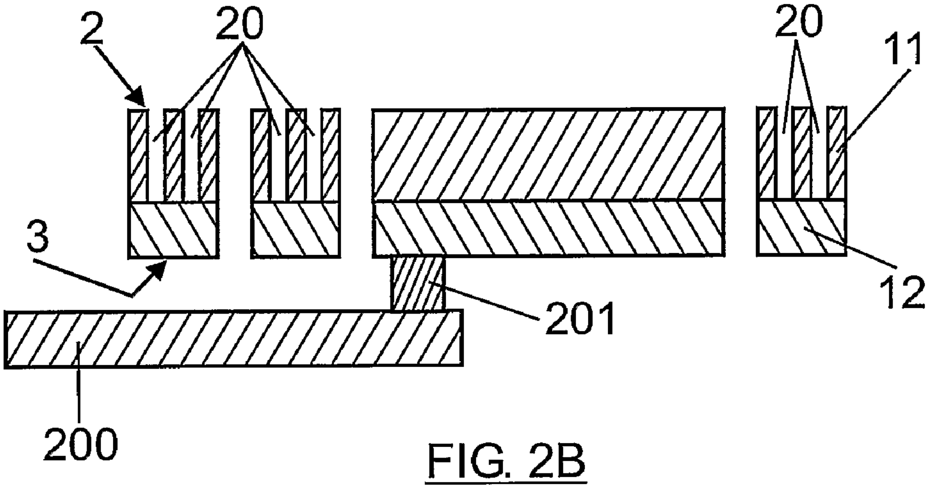
FIGS. 2A and 2B show a top view and a cross section, respectively, of a metal planar spiral inductor in accordance with a preferred embodiment of the invention.
Figure 2A:
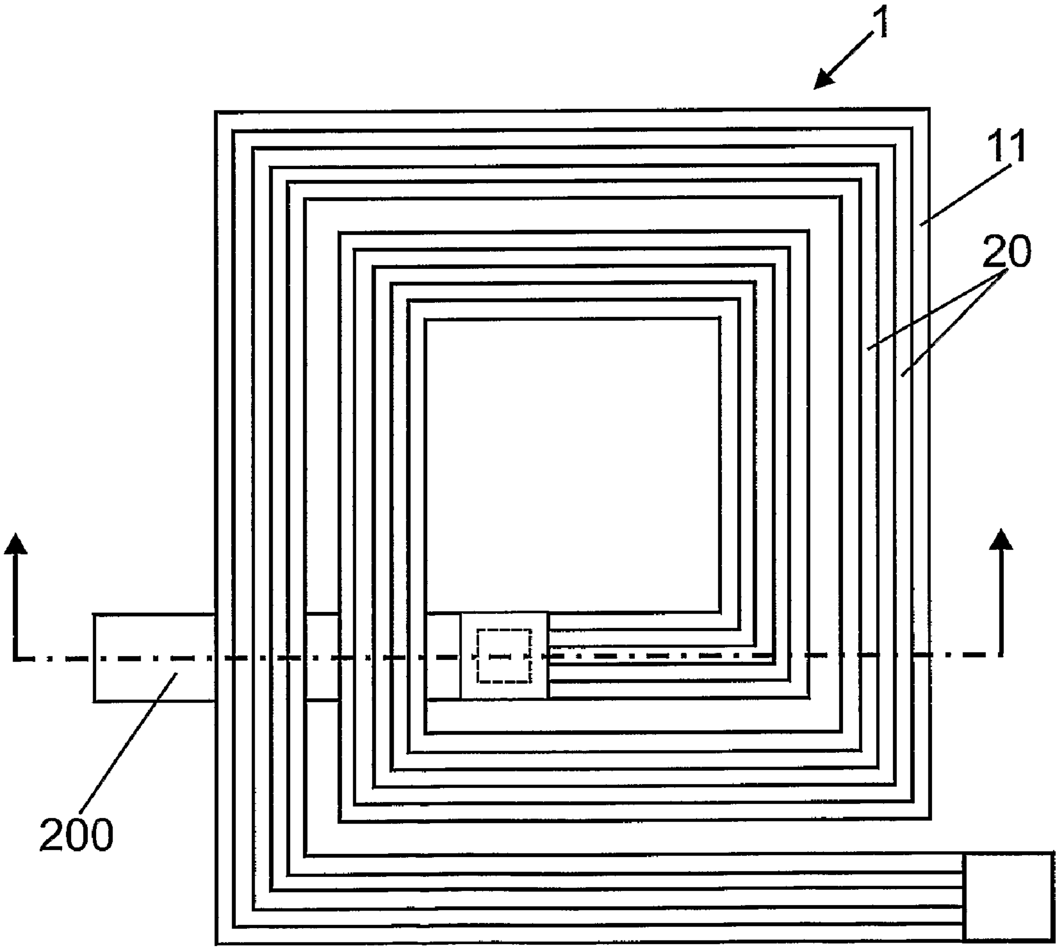

FIGS. 2A and 2B show a top view and a vertical cross section, respectively, of a spiral-shaped planar inductor 1 in accordance with an embodiment of the invention, connected to a metal conductor 200 by a so-called via 201. The inductor comprises a spiral-shaped metal element made up of a two metal layers 11 and 12 of the same metal (such as aluminium, copper, or tungsten). The inductor is provided with a plurality of grooves 20 extending along the metal element and into said element from one surface 2 of said element, in a direction substantially perpendicular to the surface of the substrate (whereas the metal layers extend along the substrate, in parallel with the surface of the substrate). In the illustrated embodiment, the grooves pass through one of the metal layers 11 and reach the surface of the other metal layer 12.

Figure 1B:
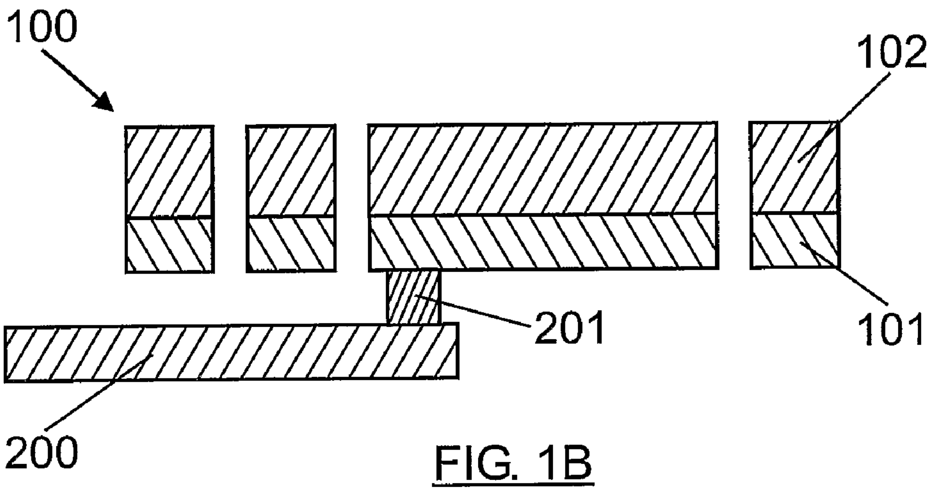
FIGS. 1A and 1B show a top view and a cross section, respectively, of a metal planar spiral inductor in accordance with the state of the art.
Figure 1A:
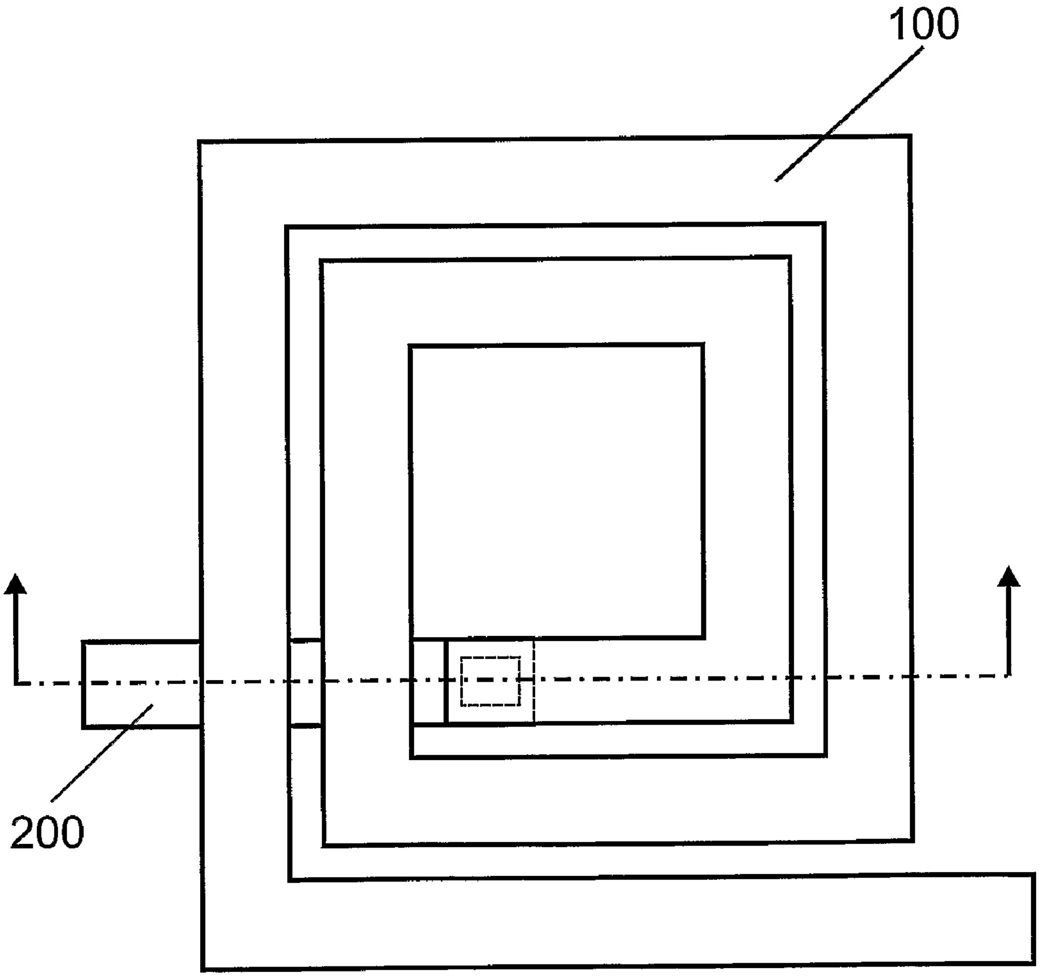

In this way and when comparing FIGS. 2A and 2B with FIGS. 1A and 1B, it is clear that the metal surface of the inductor per unit of length in the direction of extension of the spiral path has been increased by the incorporation of the grooves, without any change neither in the general outer dimensions of the inductor (height, length, width), nor in the height and width of the cross sections of the individual "windings" of the inductor, nor in the distance between the subsequent windings of the spiral. Due to the increased metal surface, the serial resistance of the inductor is reduced and its Q value increased, as explained above.

The specific dimensions of the grooves may depend on many factors, and can be varied so as to obtain optimum performance of the device and simplicity of the manufacturing process.

The structure illustrated in FIGS. 2A and 2B can be created starting by applying the metal conductor 200 layer on a substrate (not shown). Next, an isolation layer (not shown) is applied (normally, the isolation layer is made of silicon dioxide or some dielectric material), in which a hole is made, which is filled with metal (such as aluminium, copper, or tungsten), creating the via 201. On top of the isolation layer, the "non-grooved" metal layer 12 is applied, and on top of that, the "grooved" metal layer 11.

Figure 3A:
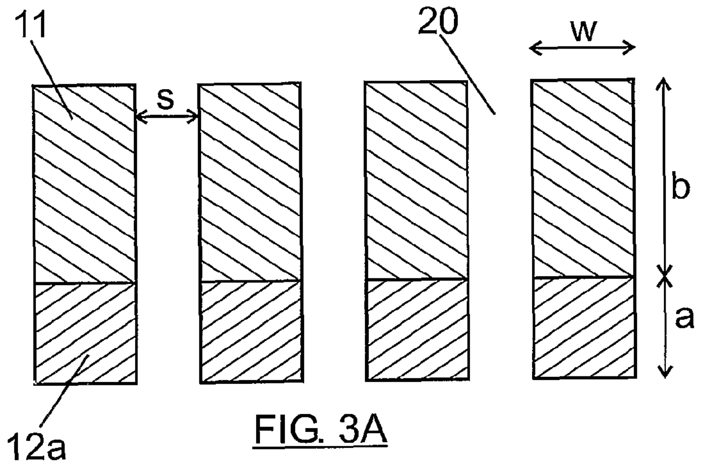
FIGS. 3A and 3B show cross sections of two alternative embodiments of the invention.

In the embodiment illustrated in FIGS. 2A and 2B, the grooves do not reach all through the metal element, but only penetrate said element down to a certain depth, said depth corresponding to the height of the upper metal layer 12. Of course, it is also possible to let the grooves penetrate the metal element from the upper surface 2 (the "grooved" surface) and all the way down to the opposite surface 3 (the "non-grooved" surface in FIG. 2B), thereby creating an element comprising parallel metal paths or threads separated from each other, as shown in FIG. 3A. This embodiment may in some cases be simpler to implement, but it does not provide for a maximum metal surface, as can be seen when comparing FIGS. 3A and 3B.

Figure 3B:
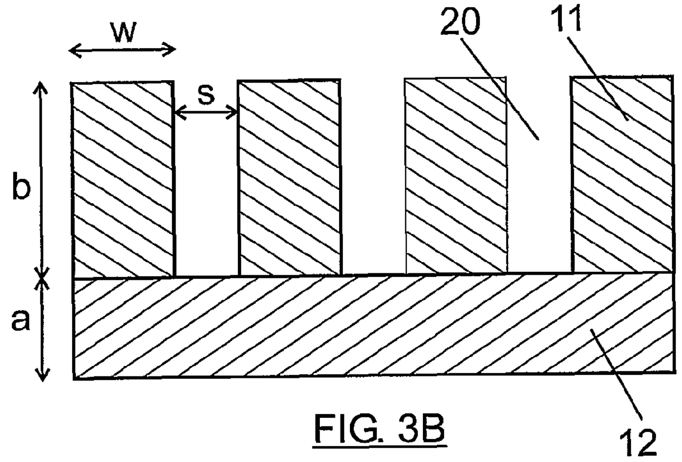

FIGS. 3A and 3B show cross sections of respective planar inductors each comprising two metal layers 11 and 12/12*a*, just like the one of FIGS. 2A and 2B, and provided with "vertical" grooves (perpendicular to the surface of the substrate); however, in FIG. 3A, the grooves extend from the upper to the lower surface of the inductor. In FIGS. 3A and 3B, a denote the height of the bottom layer 12/12*a* (we here suppose that the inductor is positioned on a substrate surface extending in the horizontal direction), b denote the height of the upper layer 11, s denote the width of the grooves and w denote the width of the metal elements separated by the grooves.

The total perimeter P of the metal parts of the cross sections of the inductors can be calculated in the following way:

The inductor of FIG. 3A, having the grooves extending all the way through the metal layers:

$$P_{3A}=4\times[2\times(a+b+w)]=8\times(a+b+w)$$

The inductor of FIG. 3B, having the grooves only extending the distance b into the inductor (that is, through the upper layer 11 but not through the lower layer 12):

$$P_{3B}=2\times(4w+3s)+2\times(a+b)+6b=2a+8b+8w+6s$$

Thus, the difference between these perimeters is:

$$P_{3B}-P_{3A}=2a+8b+8w+6s-(8a+8b+8w)=6(s-a)$$

In practical embodiments, it is often easy to make "s" larger than "a" (in practice, a is often less than 0.5 μm), whereby a larger perimeter is obtained using grooves not reaching all the way through the metal element (through all of its layers).

Also, the coupling between the metal inductor and adjacent metal lines to which it is to be connected must be considered; a contact layer without grooves can be advantageous because it provides for better coupling characteristics at its terminals.

Figure 4A:
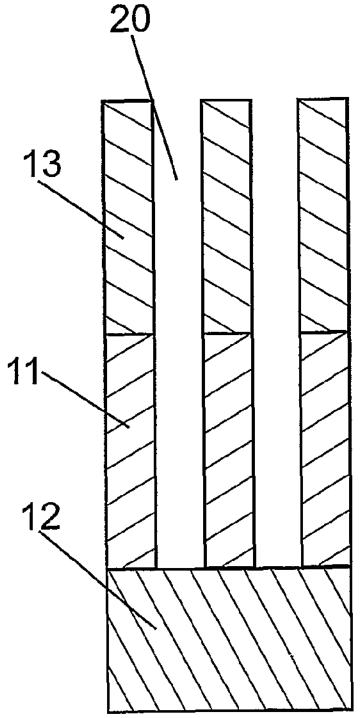
FIGS. 4A and 4B show cross sections of two further embodiments of the invention.
Figure 4B:
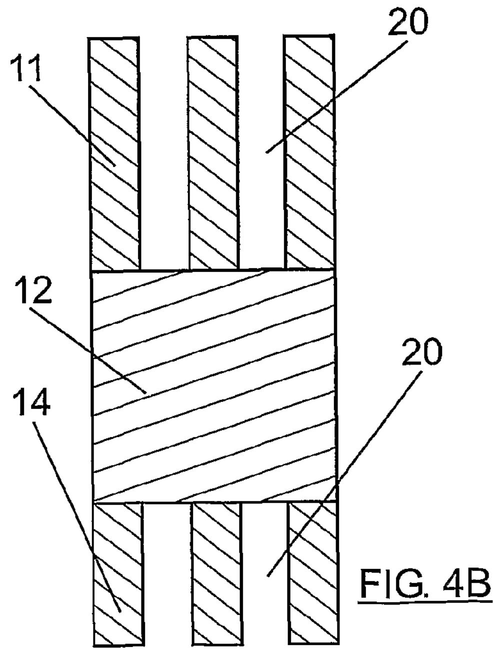

FIGS. 4A and 4B show to alternative designs, involving an additional layer: in FIG. 4A, a further layer 13 has been placed on top of layer 12, providing for a "higher" inductor and "deeper" grooves. FIG. 4B illustrates an embodiment in which an additional layer 14 has been added on the "bottom" surface of the non-grooved layer 12 (producing a "sandwich" structure with the non-grooved layer between the grooved layers). The number of layers, and which layers are to be grooved, can be decided in view of the specific characteristics desired for the inductor, in view of the available space and in view of the desired manufacturing process.

Of course, the metal part of the inductor does not necessarily be made up of a plurality of layers; also a metal part comprising one single layer, in which grooves are made that reach into said layer (optionally, even all throughout it, from the upper to the lower surface) could serve to implement the invention. However, using a plurality of layers can be advantageous from a practical point of view, as this way of manufacturing components—applying a plurality of layers until reaching a desired height—is commonly used, for example, in conventional CMOS or bipolar IC processes.

An example of such a process is outlined in FIGS. 5A-5E, which show the cross sections of some of the sections of a planar spiral inductor in accordance with an embodiment of the invention, during subsequent steps of the manufacturing process.

Figure 5A:
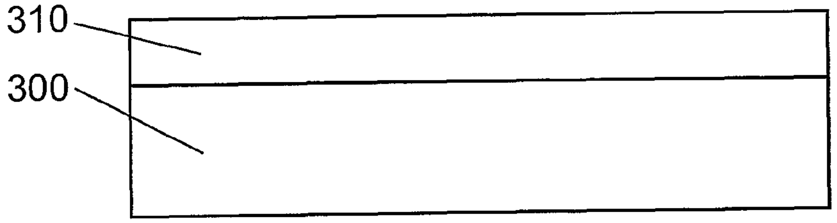
FIGS. 5A-5E show the cross sections of a section of a planar inductor in accordance with an embodiment of the invention, during subsequent steps of a manufacturing process in accordance with a preferred embodiment of the invention.

FIG. 5A shows a first step, in which a silicon dioxide layer 310 has been deposited on a silicon substrate 300.

Figure 5B:
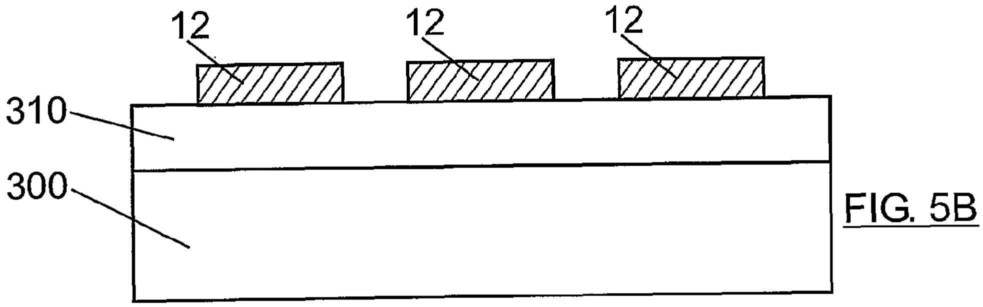

In a second step, a first metal layer is applied to parts of the upper surface of the silicon dioxide layer; the result is shown in FIG. 5B.

Figure 5C:
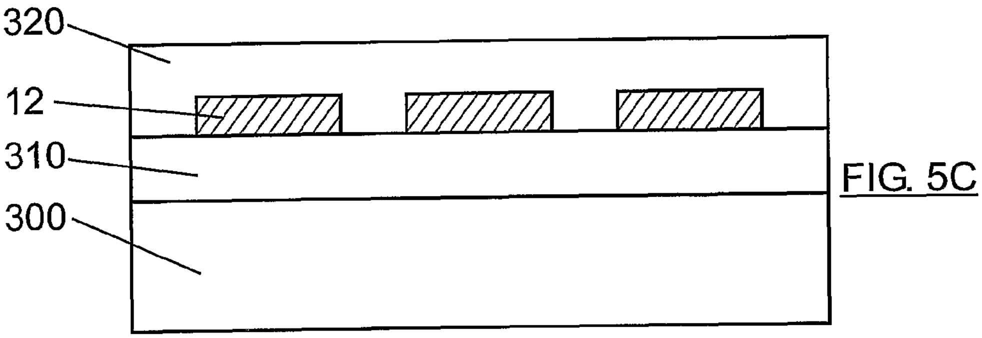

FIG. 5C shows how, in a subsequent step, a second silicon dioxide layer 320 has been applied over said first silicon dioxide layer 310 and said first metal layer 12, for providing isolation between said first metal layer and subsequent layers.

Figure 5D:
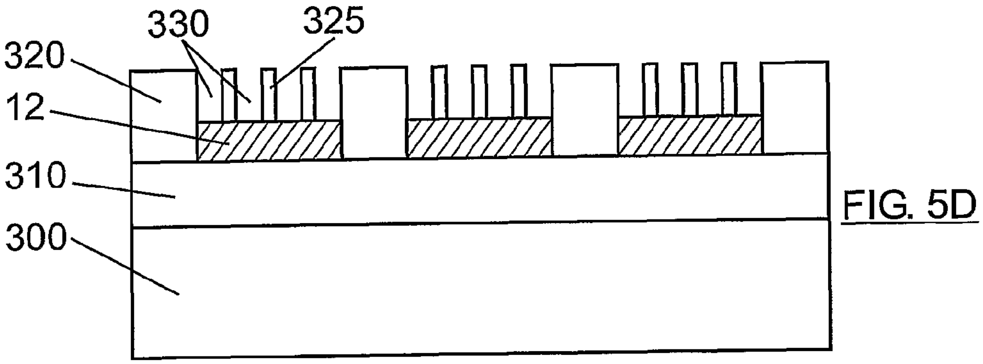
Figure 5E:
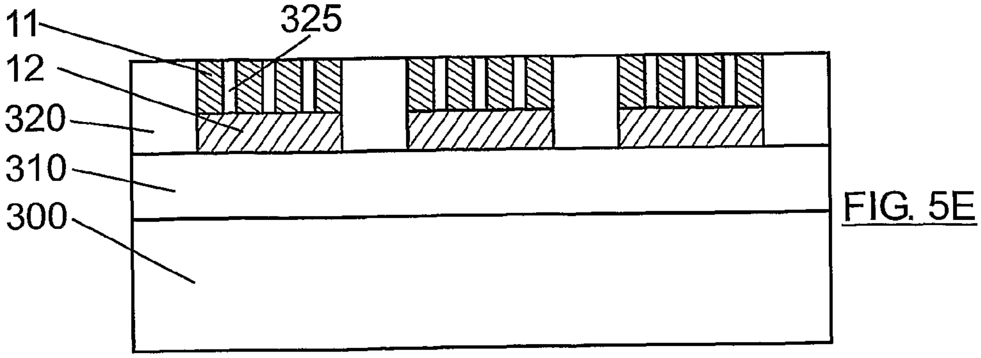

In a subsequent step, grooves 330 are made, in a conventional way, in said second silicon dioxide layer 320, thus producing a structure as shown in FIG. 5D, wherein said grooves 330 are separated by partitions 325 of silicon dioxide.

Next, metal is applied to these grooves 330, thus providing a second metal layer 11 in which the parallel metal portions are separated by the silicon dioxide partitions 325 corresponding to the grooves 20 in the metal inductor formed by layers 11 (the "grooved" layer) and 12 (the "non-grooved" layer).

Thus, in this manner, adding layers using, for example, conventional CMOS or bipolar IC processes, planar conductors can be achieved having any number of layers and grooves extending through any number of said layers.

Throughout the description and claims of the specification, the word "comprise" and variations of the word, such as "comprising", is not intended to exclude other additives, components, integers or steps.

The invention claimed is:

1. A planar inductor, comprising a metal element on a substrate, said metal element being provided with at least one groove extending along and into said element from at least one surface of said element, wherein said at least one groove extends into the element in a direction substantially perpendicular to the surface of the substrate, wherein the metal element comprises at least three superposed metal layers each extending in a direction parallel to the substrate, wherein at least one of said layers is not provided with said at least one groove, and wherein said at least one groove extends from a surface of said inductor and all through at least two of said layers until reaching the at least one layer not being provided with said at least one groove.

2. A planar inductor according to claim 1, the inductor having a spiral shape, said at least one groove also having a spiral shape corresponding to the spiral shape of the inductor.

3. A planar inductor according to claim 1, wherein said at least one groove comprises a plurality of grooves.

4. A planar inductor according to claim 3, wherein said grooves are substantially parallel with each other.

5. A planar inductor according to claim 1, said metal element having a substantially rectangular cross section.

6. A planar inductor according to claim 1, wherein the at least one groove extends into the metal element to an extent corresponding to, at least, 50% of the height of the metal element in the direction perpendicular to the surface of the substrate.

7. A planar inductor according to claim 6, wherein the at least one groove extends into the metal element to an extent corresponding to, at least, 75% of the height of the metal element in the direction perpendicular to the surface of the substrate.

8. A planar inductor, comprising a metal element on a substrate, said metal element being provided with at least one groove extending along and into said element from at least one surface of said element, wherein said at least one groove extends into the element in a direction substantially perpendicular to the surface of the substrate, wherein the metal element comprises at least three superposed metal layers each extending in a direction parallel to the substrate, wherein at least one of said layers is not provided with said at least one groove, and wherein the at least one layer not provided with said at least one groove is sandwiched between layers provided with said at least one groove.

9. A planar inductor according to claim 8, wherein, in at least a first layer of said layers provided with said at least one groove, said at least one groove extends all through said first layer, from a first surface of said first layer to a second surface of said first layer, reaching the at least one layer not provided with said at least one groove.

10. A planar inductor according to claim 8, the inductor having a spiral shape, said at least one groove also having a spiral shape corresponding to the spiral shape of the inductor.

11. A planar inductor according to claim 8, wherein said at least one groove comprises a plurality of grooves.

12. A planar inductor according to claim 11, wherein said grooves are substantially parallel with each other.

13. A planar inductor according to claim 8, said metal element having a substantially rectangular cross section.

14. A planar inductor according to claim 8, wherein the at least one groove extends into the metal element to an extent corresponding to, at least, 50% of the height of the metal element in the direction perpendicular to the surface of the substrate.

15. A planar inductor according to claim 14, wherein the at least one groove extends into the metal element to an extent corresponding to, at least, 75% of the height of the metal element in the direction perpendicular to the surface of the substrate.

16. A planar inductor, comprising a metal element on a substrate, said metal element being provided with at least one groove extending along and into said element from at least one surface of said element, wherein said at least one groove extends into the element in a direction substantially perpendicular to the surface of the substrate, wherein the metal element comprises at least two superposed metal layers each extending in a direction parallel to the substrate, wherein at least one of said layers is provided with said at least one groove, wherein at least one of said layers is not provided with said at least one groove, and wherein the at least one groove extends into the metal element to an extent corresponding to, at least, 75% of the height of the metal element in the direction perpendicular to the surface of the substrate.

17. A planar inductor according to claim 16, wherein, said at least one groove extends all through said at least one layer provided with said at least one groove, from a first surface of said layer to a second surface of said layer, reaching said at least one layer not provided with said at least one groove.

18. A planar inductor according to claim 16, wherein the metal element comprises at least three metal layers, said at least one groove extends from a surface of said inductor and all through at least two of said layers until reaching the at least one layer not provided with said at least one groove.

19. A planar inductor according to claim 16, wherein the metal element comprises at least three metal layers, the at least one layer not provided with said at least one groove sandwiched between layers being provided with said at least one groove.

20. A planar inductor according to claim 16, the inductor having a spiral shape, said at least one groove also having a spiral shape corresponding to the spiral shape of the inductor.

21. A planar inductor according to claim 16, wherein said at least one groove comprises a plurality of grooves.

22. A planar inductor according to claim 21, wherein said grooves are substantially parallel with each other.

23. A planar inductor according to claim 16, said metal element having a substantially rectangular cross section.

24. A method of manufacturing a planar inductor, comprising the steps of:

applying a metal element onto a substrate; and providing said metal element with grooves;

wherein the grooves are made to extend into the metal element in a direction substantially perpendicular to the surface of the substrate, wherein the step of applying a metal element onto a substrate comprises the step of applying at least one metal layer onto the substrate; and wherein the step of providing the metal element with grooves comprises the steps of:

applying a non-metal material on said at least one metal layer;

creating grooves in said non-metal material, said grooves being separated by partitions of said non-metal material; and filling said grooves with metal, thus creating a grooved metal layer.

* * * * *